United States Patent
Lai et al.

(10) Patent No.: US 9,537,093 B1
(45) Date of Patent: Jan. 3, 2017

(54) MEMORY STRUCTURE

(71) Applicant: MACRONIX INTERNATIONAL CO., LTD., Hsinchu (TW)

(72) Inventors: Erh-Kun Lai, Taichung (TW); Hsiang-Lan Lung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/044,280

(22) Filed: Feb. 16, 2016

(51) Int. Cl.
*H01L 29/02* (2006.01)
*H01L 45/00* (2006.01)
*H01L 27/24* (2006.01)

(52) U.S. Cl.
CPC .......... *H01L 45/12* (2013.01); *H01L 27/2427* (2013.01); *H01L 27/2481* (2013.01); *H01L 45/06* (2013.01); *H01L 45/1233* (2013.01); *H01L 45/1253* (2013.01)

(58) Field of Classification Search
CPC .................................. H01L 45/04; H01L 27/24
USPC ....................................................... 257/2, 4
See application file for complete search history.

(56) References Cited

U.S. PATENT DOCUMENTS 6,819,581 B2 * 11/2004 Ito .......................... G11C 11/22
                                                                257/E21.664
2013/0240824 A1 * 9/2013 Oh ....................... H01L 45/1233
                                                                257/4

OTHER PUBLICATIONS

Kim, et al.: "A Phase Change Memory Cell with Metallic Surfactant Layer as a Resistance Drift Stabilizer"; 978-1-4799-2306-9/13/$31.00 © 2013 IEEE; pp. 30.7.1-30.7.4.
"A Revolutionary Breakthrough in Memory Technology"; Santa Clara, Calif., and Boise, Idaho, Jul. 28, 2015; pp. 1-11.

* cited by examiner

*Primary Examiner* — Tan N Tran
(74) *Attorney, Agent, or Firm* — McClure, Qualey & Rodack, LLP

(57) ABSTRACT

A memory structure is disclosed. The memory structure comprises a phase change material layer, a first electrode, a second electrode, and conductive spacers. The second electrode and the first electrode are electrically connected to an upper surface and a lower surface of the phase change material layer respectively. The conductive spacers are separated from each other and on side surfaces of the phase change material layer.

16 Claims, 21 Drawing Sheets

MEMORY STRUCTURE

BACKGROUND

Technical Field

The disclosure relates to a memory structure, and particularly to a phase change memory (PCM) structure.

Description of the Related Art

Phase-change based memory materials, such as chalcogenide-based materials and similar materials, can be caused to change phase between an amorphous phase and a crystalline phase by application of electrical current at levels suitable for implementation in integrated circuits. In comparison with the crystalline phase, the amorphous phase is characterized by a higher electrical resistivity which can be readily sensed to indicate data. These properties may cause the chalcogenide-based materials suitable for serving as programmable resistive material to form nonvolatile memory circuits, which can be read and written with random access, e.g a phase-change memory devices.

A phase-change memory device can be read and written with random access by the transformations between the amorphous phase and the crystalline phase occurring on the chalcogenide-based materials disposed in the active area of the phase-change memory device. For example, the phase of the chalcogenide-based materials (phase-change materials) disposed in the active area of the phase-change memory device may be transformed from the amorphous phase to the crystalline phase when a low-voltage electric pulse is applied to the active area of the memory cells, whereby the resistance states of the memory cells involved in the phase-change memory device may be transformed either from an initial state or from a high resistance state to a low resistance state. The process of transforming resistance state form high to low is referred as a set process. Alternatively, the low resistance state of the memory cells may be transformed to the high resistance state again by applying a high-voltage electric pulse to the active area of the memory cells in order to transform the crystalline phase of the chalcogenide-based materials to the amorphous phase. The process of transforming resistance state form low to high is referred as a reset process.

However after a plurality numbers of read, set and reset operations are carried out, degradations of the phase-change materials may occur due to the electrical energy applied to the phase-change materials during the set/reset operations, the operation temperature and/or the arrangement of the memory cells. Such that the electrical properties, such as resistance state, relationship between the resistance and the current etc., of the phase-change material may shifted from an initial state.

SUMMARY

The present disclosure relates to a memory structure.

According to an embodiment, a memory structure is disclosed. The memory structure comprises a phase change material layer, a first electrode, a second electrode, and conductive spacers. The second electrode and the first electrode are electrically connected to an upper surface and a lower surface of the phase change material layer respectively. The conductive spacers are separated from each other and on side surfaces of the phase change material layer.

According to another embodiment, a memory structure is disclosed. The memory structure comprises a first electrode, a second electrode, a phase change material layer, and conductive spacers. The phase change material layer is electrically connected between the first electrode and the second electrode. The conductive spacers are separated from each other. Each of the conductive spacers contacts with the first electrode, the second electrode and the phase change material layer at same time.

According to yet another embodiment, a memory structure is disclosed. The memory structure comprises a first electrode, a second electrode, conductive spacers, and a phase change material layer. The phase change material layer has an upper surface and a lower surface respectively electrically connected to the first electrode and the second electrode. The phase change material layer has only two opposing side surfaces having the conductive spacers thereon.

The above and other embodiments of the disclosure will become better understood with regard to the following detailed description of the non-limiting embodiment(s). The following description is made with reference to the accompanying drawings.

DETAILED DESCRIPTION

Embodiments disclosure herein relate to a memory structure and a method for forming the memory structure. According to embodiments, side surfaces of a phase change material layer of a memory structure have conductive spacers capable of providing surfactant effect thereon, therefore the memory structure has a stable resistance and stable operating efficiency. In a method for forming the memory structure, the conductive spacers can be used as an etching mask, and therefore can prevent the structure from undesired damage to improve product yield.

The illustrations may not be necessarily be drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments.

Figure 1A:
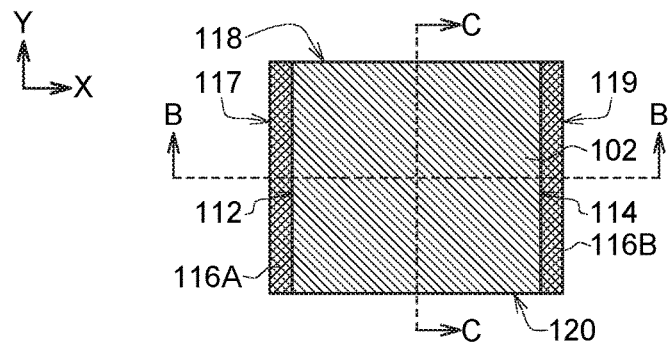
FIG. 1A to FIG. 1C illustrate an memory cell of a memory structure according to an embodiment.

FIG. 1A to FIG. 10 illustrate an memory cell of a memory structure according to an embodiment. FIG. 1B is a cross-section view along a BB line of the memory structure shown in FIG. 1A. FIG. 10 is a cross-section view along a CC line of the memory structure shown in FIG. 1A. FIG. 1A is a top view along an AA line of the memory structure shown in FIG. 1B and FIG. 10. The BB line of FIG. 1A may be parallel to a first direction. The CC line of FIG. 1A may be parallel to a second direction. The first direction and the second direction are different. In an embodiment, the first direction is parallel to X-axis, and the second direction is parallel to Y-axis.

Referring to FIG. 1A to FIG. 10, the memory structure comprises a phase change material layer 102, a first electrode 104, a second electrode 106, and conductive spacers 116A, 116B separated from each other. The phase change material layer 102 may comprise a switch material. For example, the phase change material layer 102 may comprise a germanium antimony telluride (GST), or other suitable materials having a resistance changeable when a phase of which changes. The phase change material layer 102 is electrically connected between the first electrode 104 and the second electrode 106. Alternatively, a lower surface 110 and an upper surface 108 of the phase change material layer 102 are electrically connected to the first electrode 104 and the second electrode 106, respectively.

Referring to FIG. 1A to FIG. 10, conductive spacers 116A, 116B are on opposing side surfaces 112, 114 of the phase change material layer 102, the first electrode 104 and the second electrode 106, and no conductive spacer is on opposing side surfaces 118, 120 of the phase change material layer 102, the first electrode 104 and the second electrode 106. The memory structure is not limited to a design of a rectangular shape having four side surfaces 112, 114, 118, 120 as shown in FIG. 1A, wherein only two opposing side surfaces 112, 114 have conductive spacers 116A, 116B thereon. In other embodiments, the memory structure may designed to have other kinds of polygon shapes (not shown), wherein the conductive spacers are disposed onto side surface not adjoined with each other so that the conductive spacers are separated from each other. The conductive spacers 116A, 116B are electrically connected between the first electrode 104 and the second electrode 106. The memory structure has the phase change material layer 102 having the side surfaces 112, 114 having the conductive spacers 116A, 116B thereon and for providing surfactant effect, thus has a stable resistance and a stable operating efficiency.

Figure 1B:
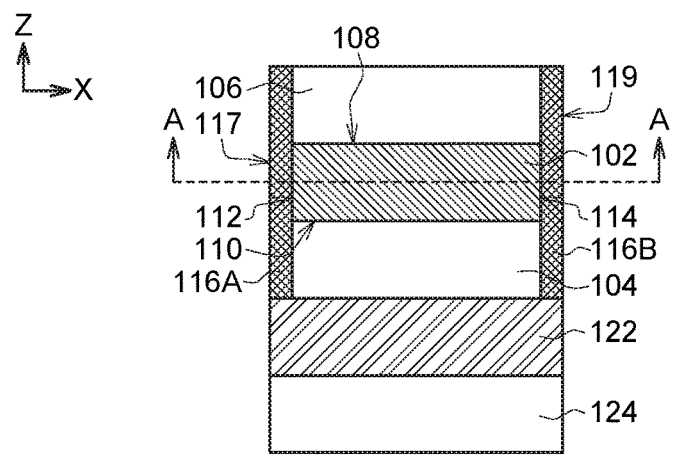
Figure 1C:
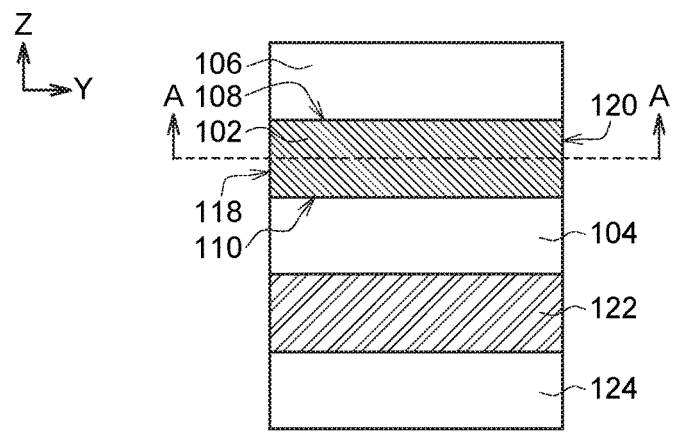

Referring to FIG. 1B and FIG. 10, the memory structure may further comprise a switch material 122 electrically connected to the first electrode 104. The conductive spacers 116A, 116B may on the switch material 122. The switch material 122 of the memory cell may be functioned as a selector. The conductive spacers 116A, 116B and the switch material 122 may have coplanar side surfaces 117, 119. The memory structure may further comprise an electrode layer 124 electrically connected to the switch material 122.

FIG. 2A to FIG. 14E illustrate a method for forming a memory structure according to an embodiment. In FIG. 2A to FIG. 14E, cross-section views marked with "B", "C", "D", "E" are respectively taken along a BB line, a CC line, a DD line, a EE line in top views marked with "A". The BB line and the DD line may be parallel to a first direction. The CC line and the EE line may be parallel to a second direction. The first direction and the second direction are different. In an embodiment, the first direction is parallel to X-axis, and the second direction is parallel to Y-axis.

Figure 2A:
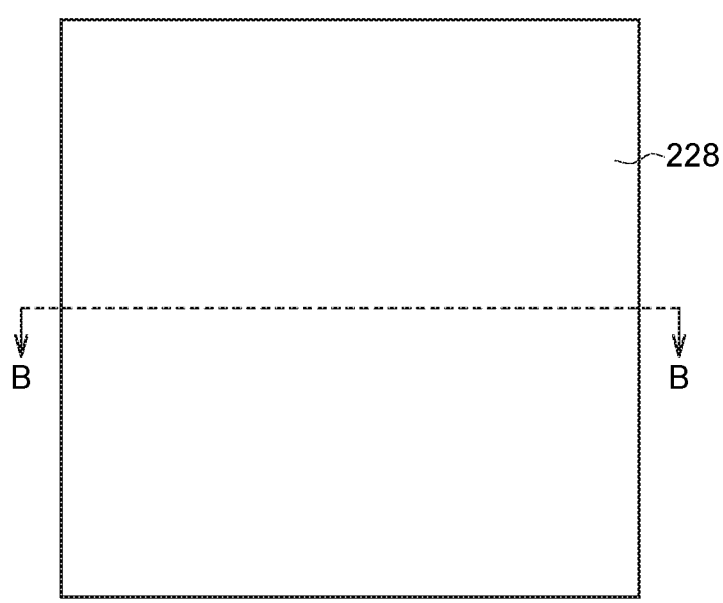
FIG. 2A to FIG. 14E illustrate a method for forming a memory structure according to an embodiment.
Figure 2B:
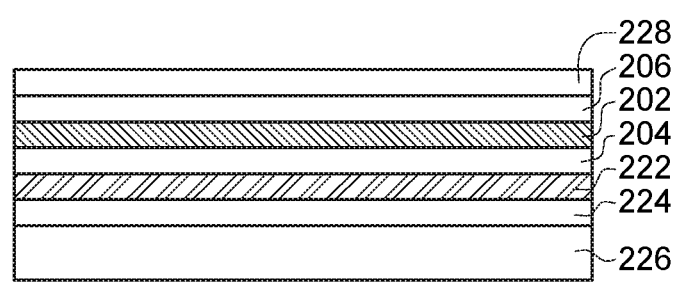

Referring to FIG. 2A and FIG. 2B, an electrode layer 224, a switch material 222, a first electrode 204, a phase change material layer 202, a second electrode 206 and a hard mask layer 228 may be formed on a substrate 226 in sequence. The substrate 226 may comprise an insulating material, such as an oxide (for example a buried oxide), a nitride (such as SiN), or other suitable insulator material.

In an embodiment, the electrode layer 224 may comprise a multi-film structure of TiN/W/TiN. The first electrode 204 may comprise TiN. The phase change material layer 202 may comprise a germanium antimony telluride. The second electrode 206 may comprise a multi-film structure of TiN/W. The hard mask layer 228 may comprise an oxide such as silicon oxide. However, the present disclosure is not limited thereto. In other embodiments, the electrode layer 224, the first electrode 204, the second electrode 206 may use other materials or structures, such as a multi-film conductive structure or a single-film conductive structure. For example, the first electrode 204 may comprise carbon, carbon nanotubes, graphene, SiC, etc. The hard mask layer 228 may comprise SiN or an oxide (OX) or other materials.

Figure 3A:
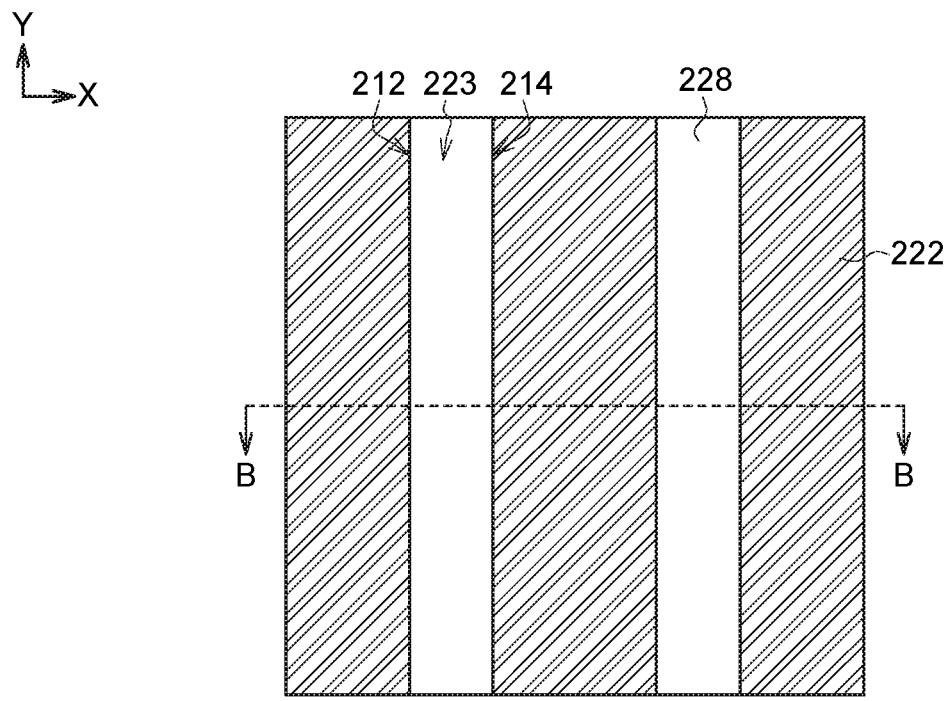
Figure 3B:
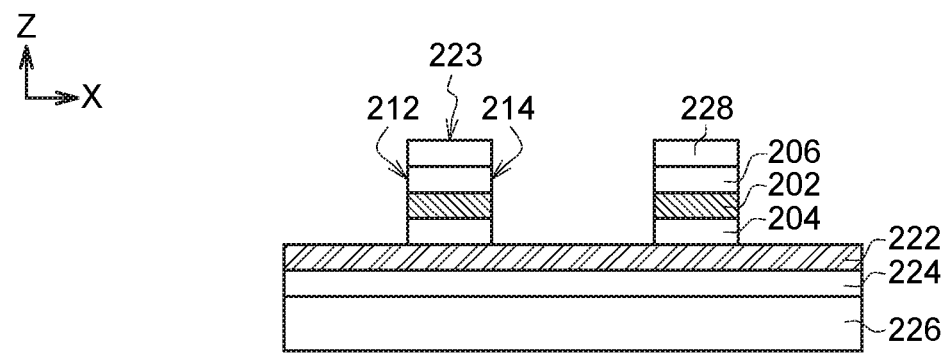

Referring to FIG. 3A and FIG. 3B, a patterning step is performed to form the patterned hard mask layer 228 extending in the second direction (or Y-axis direction). Then, an etching step using the hard mask layer 228 as an etching mask is performed to transfer the pattern down to the second electrode 206, the phase change material layer 202 and the first electrode 204 to form a patterned stack 223. The etching step may stop on the switch material 222. In other embodiments, the etching step may stop on the first electrode 204.

Figure 4A:
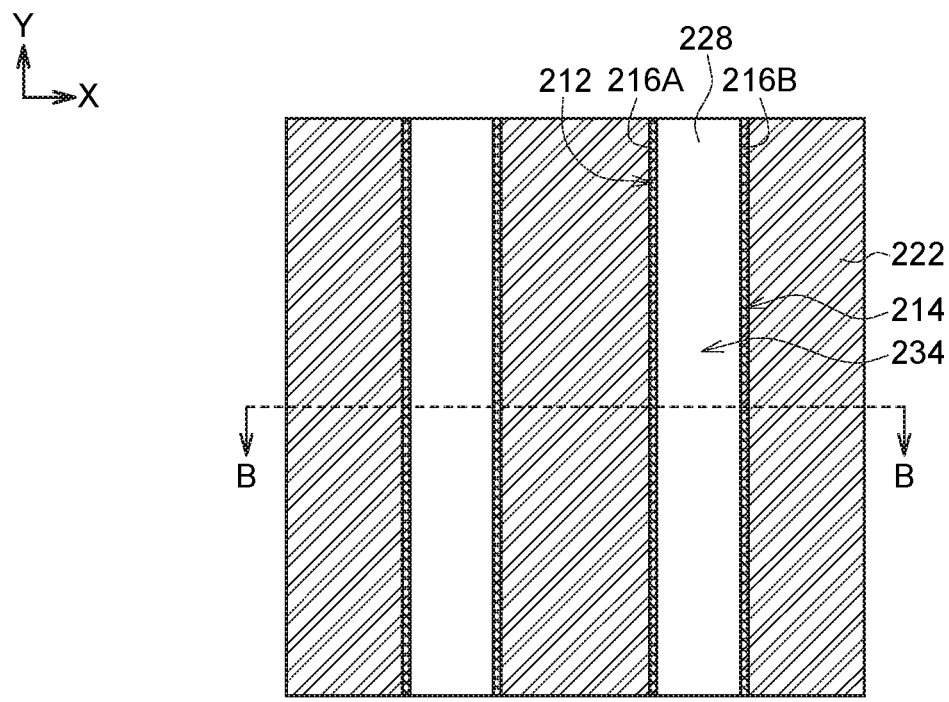
Figure 4B:
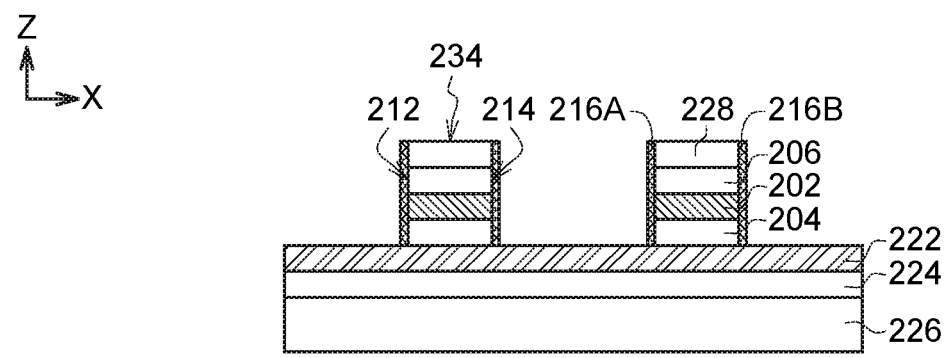

Referring to FIG. 4A and FIG. 4B, conductive spacers 216A, 216B are formed on side surfaces 212, 214 (extending along the second direction or Y-axis direction) of the stack 223 (FIG. 3A and FIG. 3B) to form a stack 234. In an embodiment, the conductive spacers 216A, 216B comprise TiN. However, the present disclosure is not limited thereto. In other embodiments, the conductive spacers 216A, 216B may comprise TiAlN, TaN, TaAlN, or other suitable metal nitrides. The conductive spacers 216A, 216B may have thicknesses between 20 angstroms to 50 angstroms. For example, the conductive spacers 216A, 216B may be formed by a method comprising depositing a conductive material on the stack 223 (FIG. 3A and the FIG. 3B) and the switch material 222, and removing a portion of the conductive material on upper surfaces of the switch material 222 and the hard mask layer 228 by an anisotropic etching to remain a portion of the conductive material on the side surfaces 212, 214 of the stack 223 to form the conductive spacers 216A, 216B. The conductive material may have a thickness between 10 angstroms to 60 angstroms.

Figure 5A:
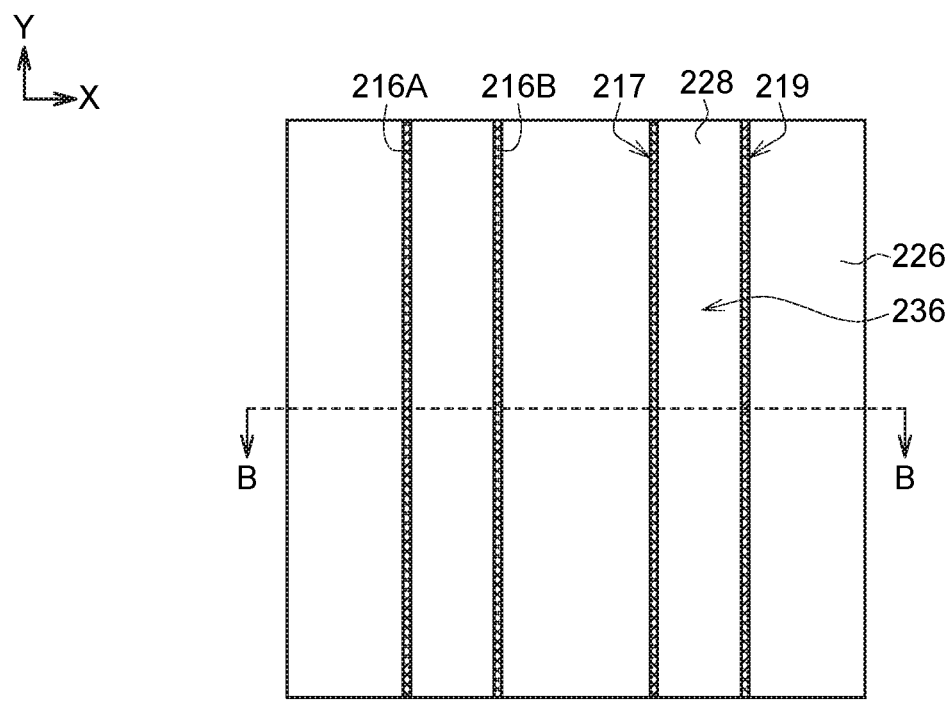
Figure 5B:
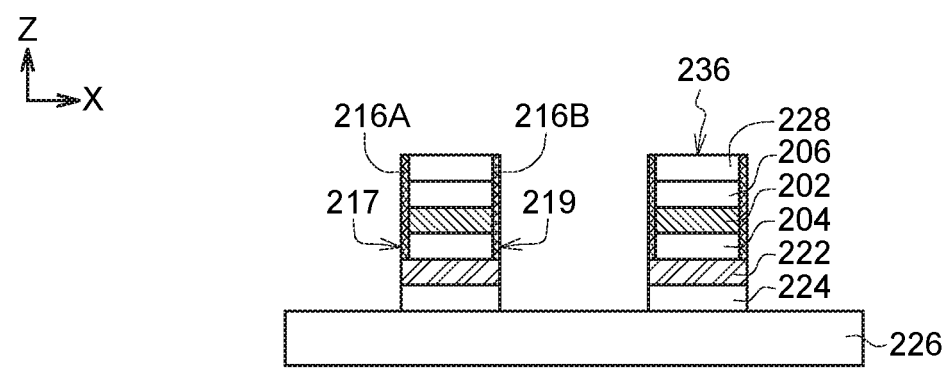

Referring to FIG. 5A and FIG. 5B, an etching step using the stack 234 (FIG. 4A and FIG. 4B) as an etching mask is performed to transfer the pattern down to the switch material 222 and the electrode layer 224 to form a stack 236 having coplanar side surfaces 217, 219. The etching step may stop on the substrate 226. The hard mask layer 228 and the conductive spacers 216A, 216B used as the etching mask can prevent the first electrode 204, the phase change material layer 202 and the second electrode 206 from damages during the etching step.

Figure 6A:
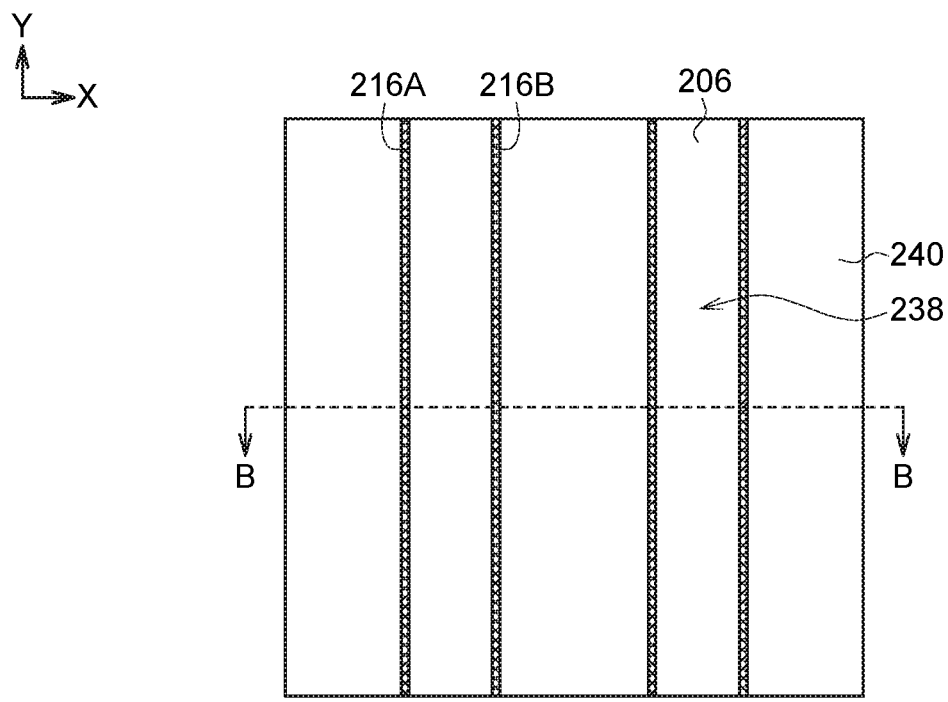
Figure 6B:
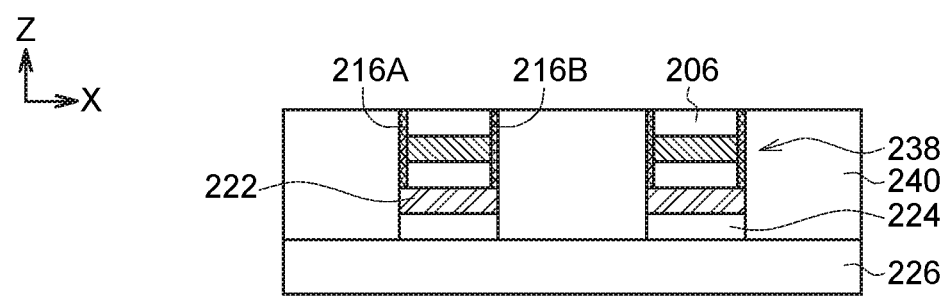

Referring to FIG. 6A and FIG. 6B, an insulating layer 240 may be formed on the substrate 226. In an embodiment, the insulating layer 240 may comprise a lower temperature oxide (LTO) or lower temperature SiN. Using a lower temperature to form the insulating layer 240 can avoid composition change of the phase change material or the switch materials. In other embodiments, the insulating layer 240 may comprise insulating materials formed by other suitable processes, such as silicon nitride or silicon oxynitride, etc. Portions of the hard mask layer 228 (FIG. 5A and FIG. 5B), the conductive spacers 216A, 216B, insulating layer 240 over the second electrode 206 may be removed to form a stack 238. In an embodiment, a CMP method may be used for the removing step. In an embodiment, the etching step may stop on the W film of the TiN/W second electrode 206.

Figure 7A:
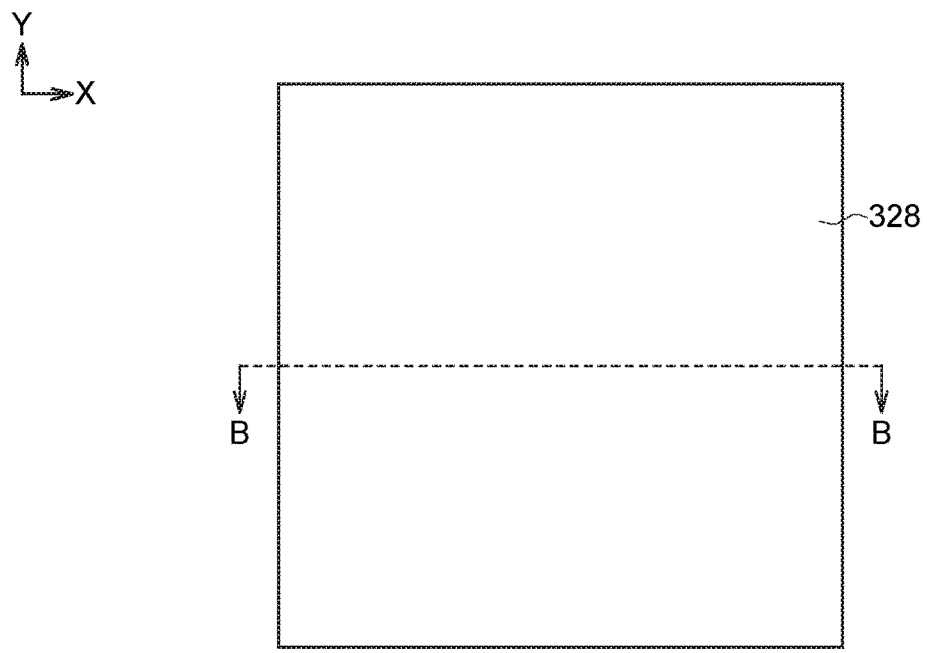
Figure 7B:
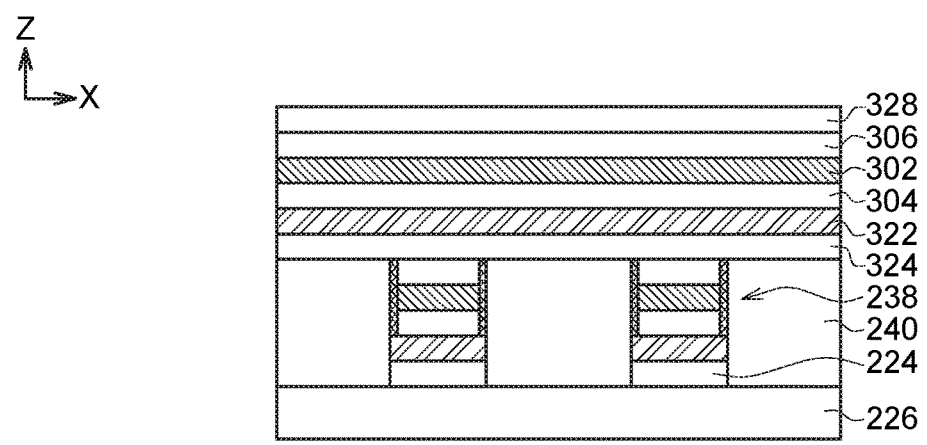

Referring to FIG. 7A and FIG. 7B, an electrode layer 324, a switch material 322, a first electrode 304, a phase change material layer 302, a second electrode 306 and a hard mask layer 328 are deposited on the stack 238 and the insulating layer 240 in sequence.

In an embodiment, the electrode layer 324 may comprise a multi-film structure of TiN/W/TiN. The first electrode 304 may comprise TiN. The phase change material layer 302 may comprise a germanium antimony telluride. The second electrode 306 may comprise a multi-film structure of TiN/W. The hard mask layer 328 may comprise an oxide, such as silicon oxide. However, the present disclosure is not limited thereto. In other embodiments, the electrode layer 324, the first electrode 304, the second electrode 306 may use other materials or structures, such as a multi-film conductive structure or a single-film conductive structure.

Referring to FIG. 8A to FIG. 8D, a patterning step is performed to form the patterned hard mask layer 328 extending in the first direction (or X-axis direction). Then, an etching step is performed to transfer the pattern down and stop on the electrode layer 224 to form a patterned stack 339. In an embodiment, opposing two side surfaces 218, 220 adjoined between the side surfaces 212, 214 of a memory cell in an lower level are defined through the etching step. The side surfaces 218, 220 have no conductive spacers thereon. In an embodiment, side surfaces 318, 320 of the stack 339 (or a memory cell in an upper level) on the memory cell in the lower level are defined by the etching step.

Figure 8A:
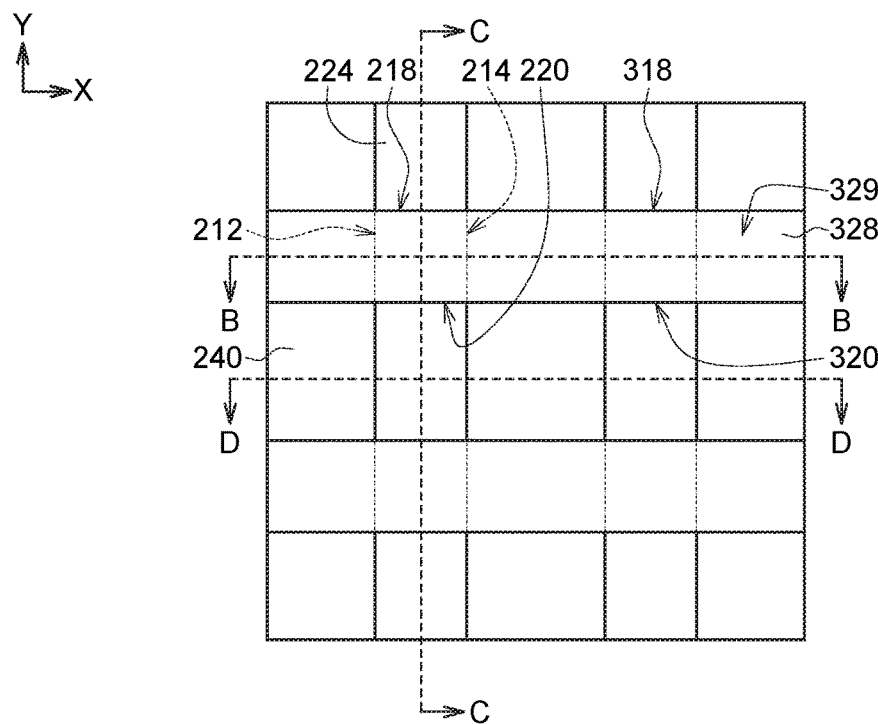
Figure 8B:
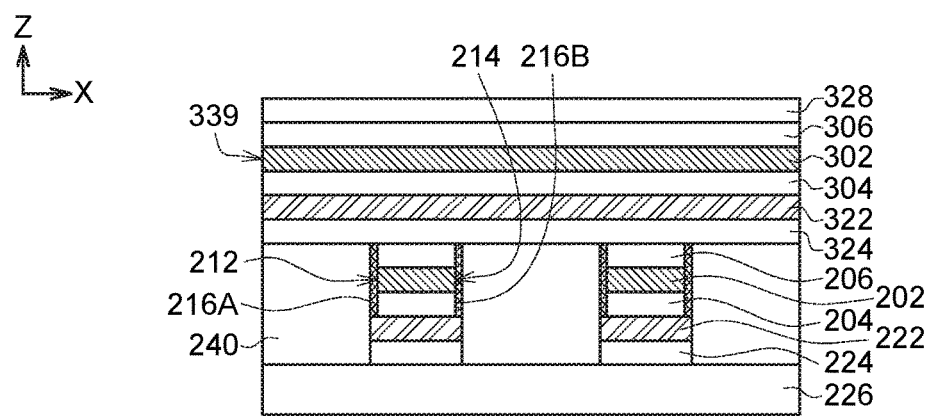
Figure 8C:
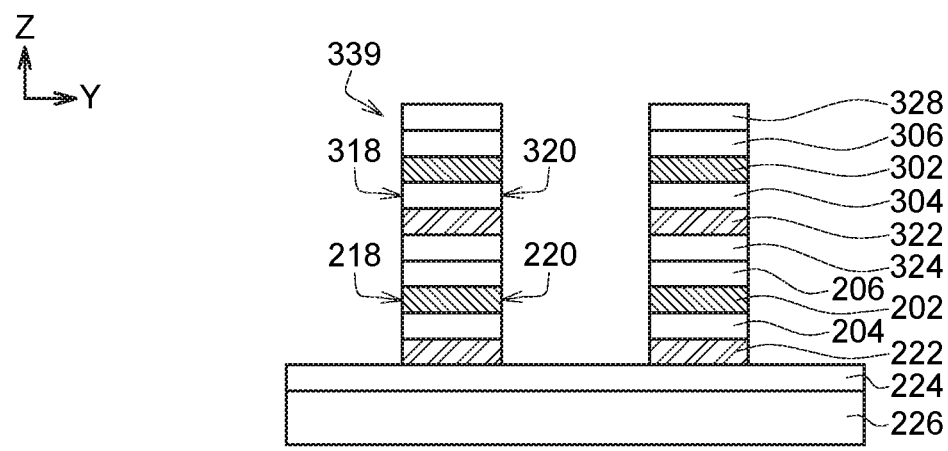
Figure 8D:
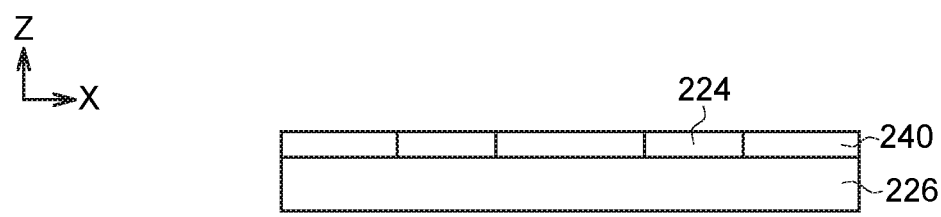
Figure 9A:
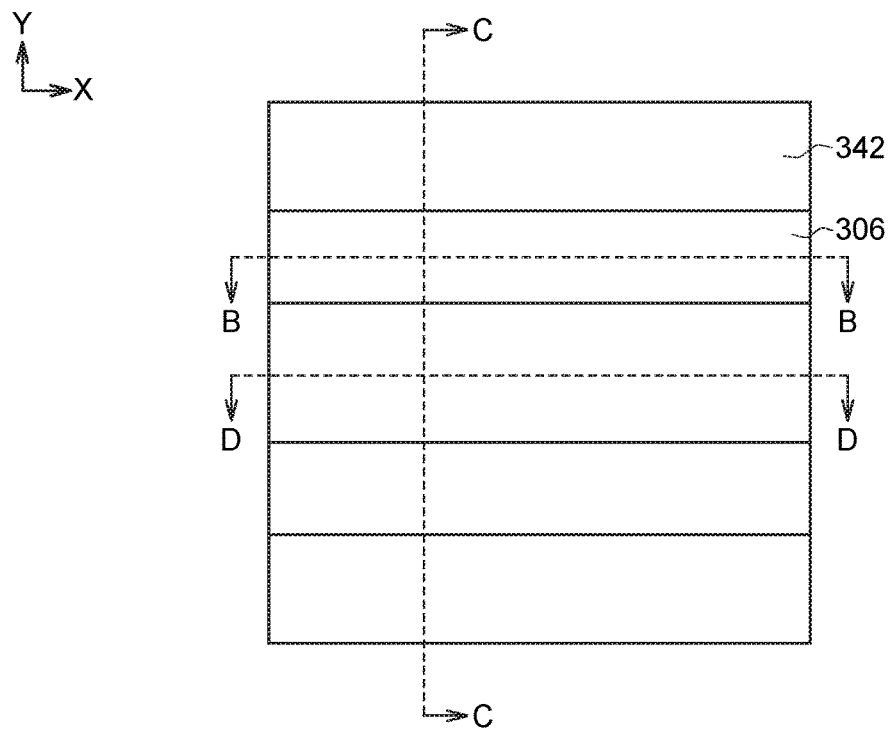
Figure 9B:
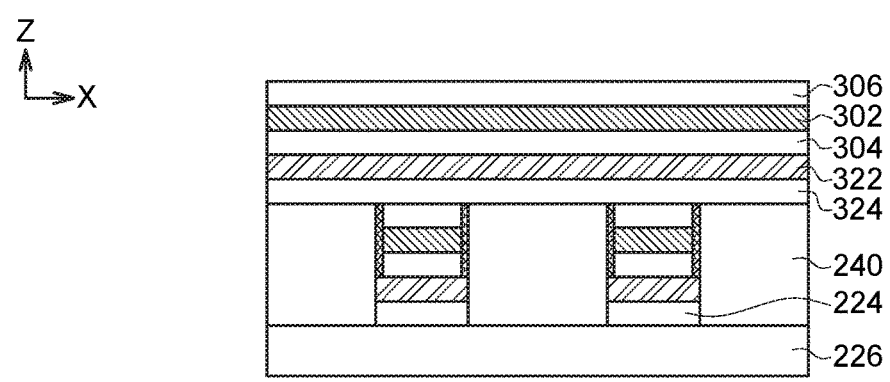
Figure 9C:
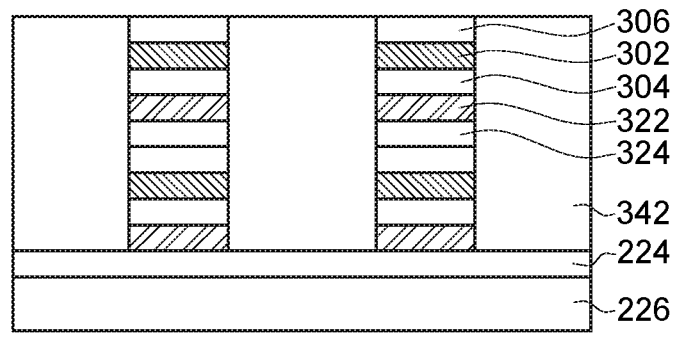
Figure 9D:
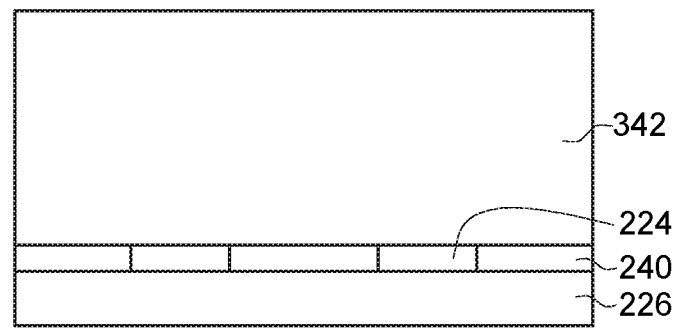
Figure 10A:
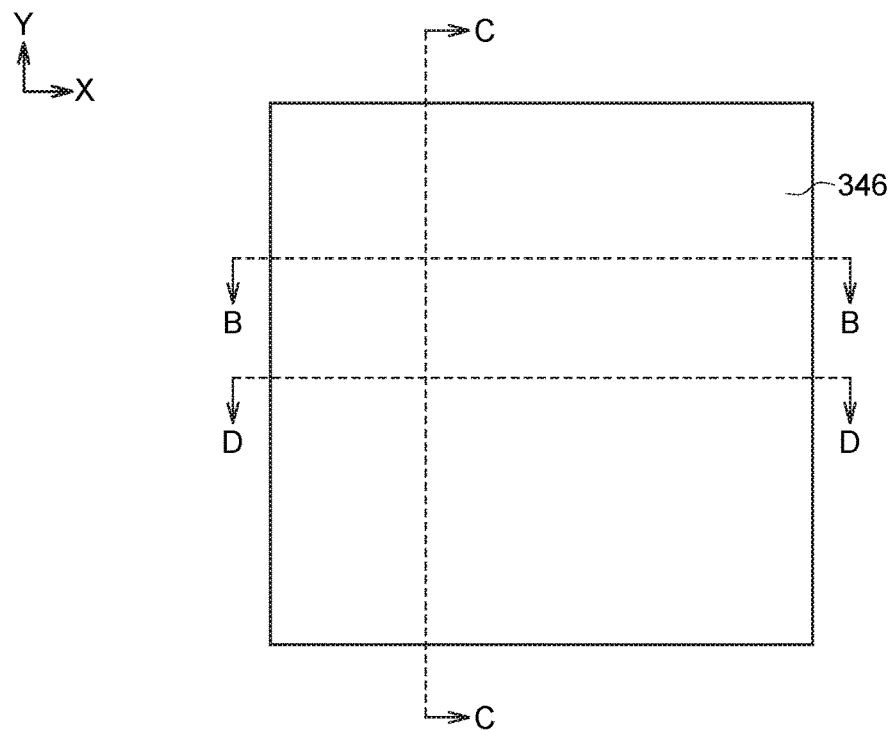
Figure 10B:
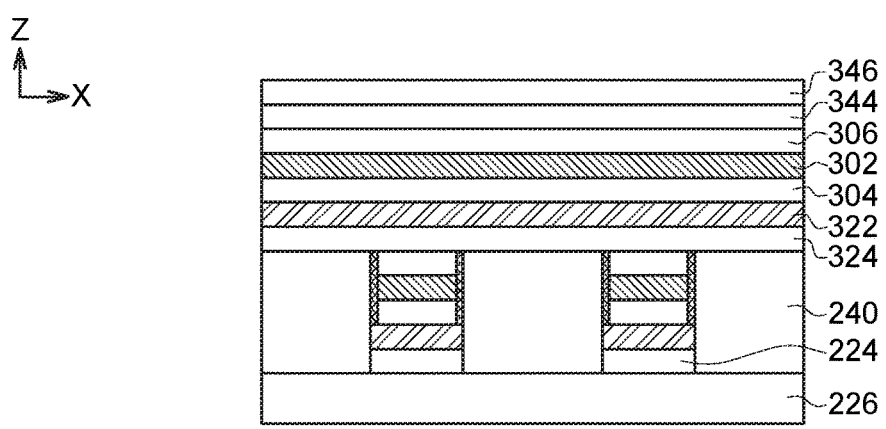
Figure 10C:
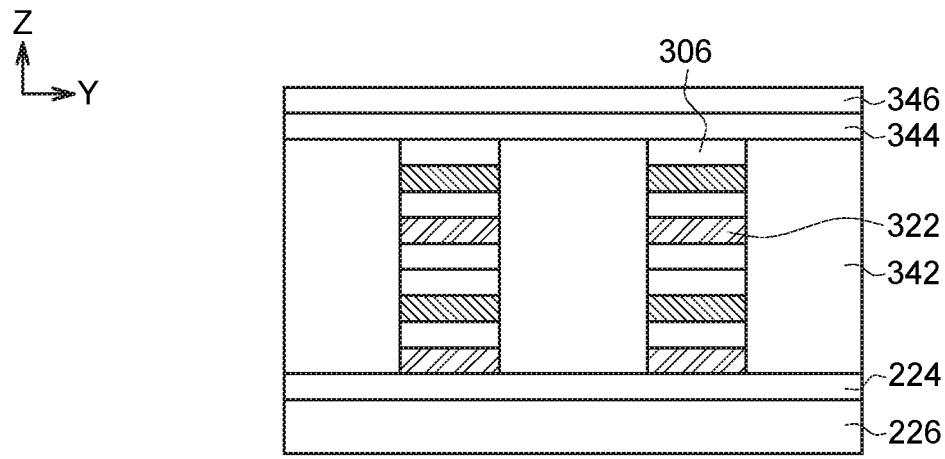
Figure 10D:
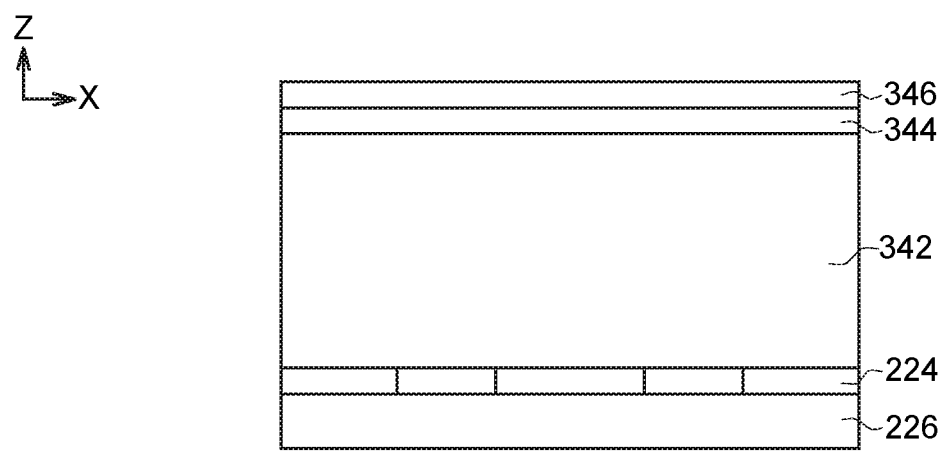
Figure 11A:
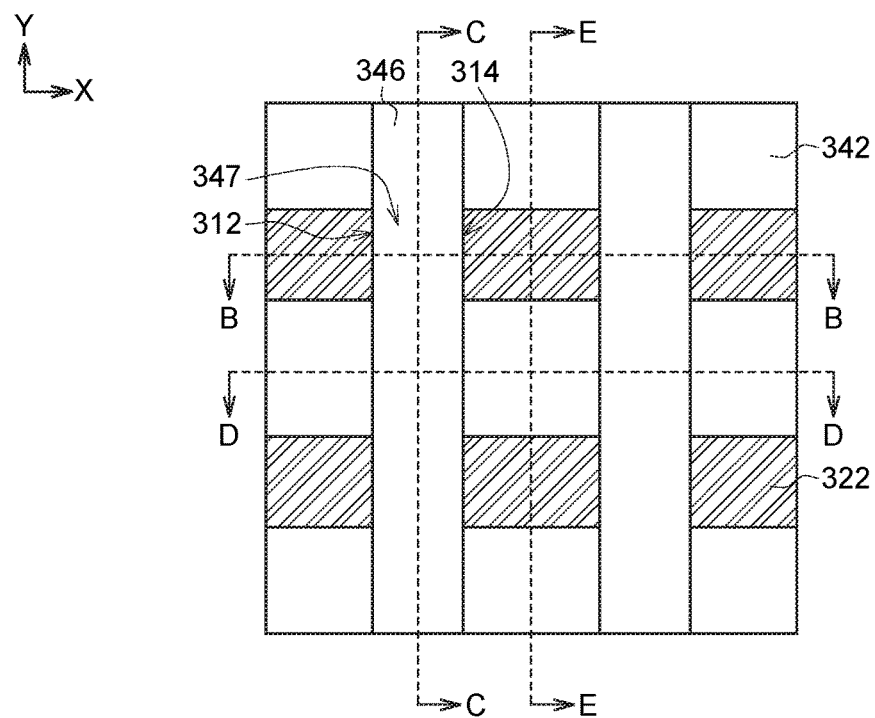
Figure 11B:
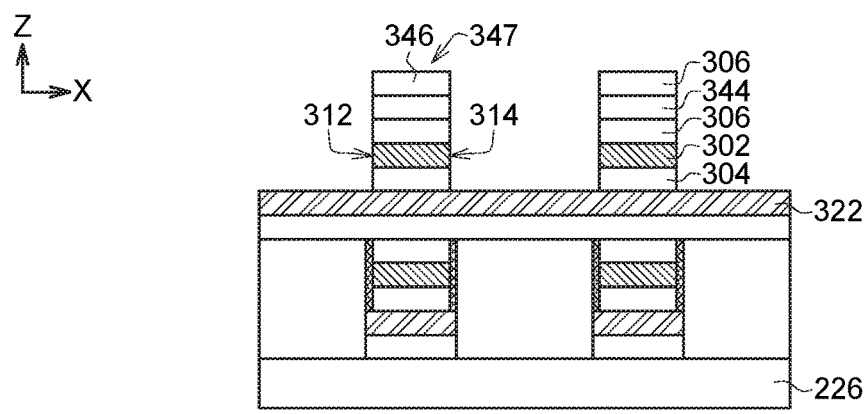
Figure 11C:
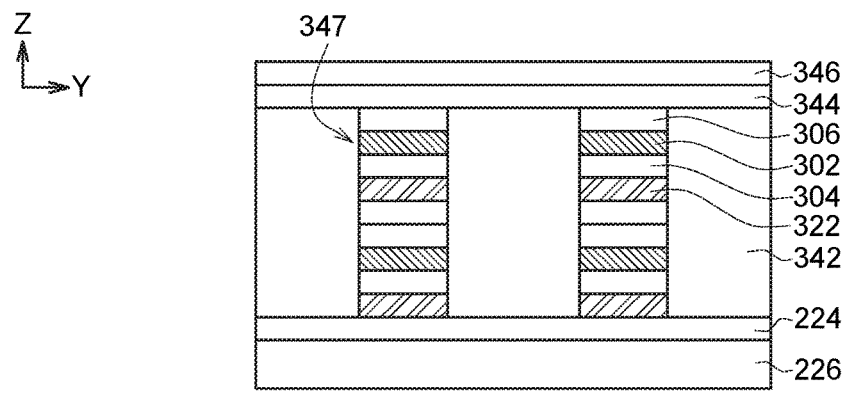
Figure 11D:
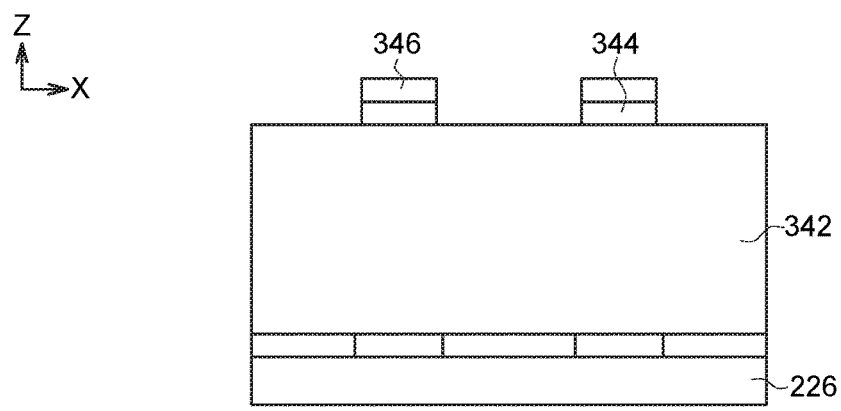
Figure 11E:
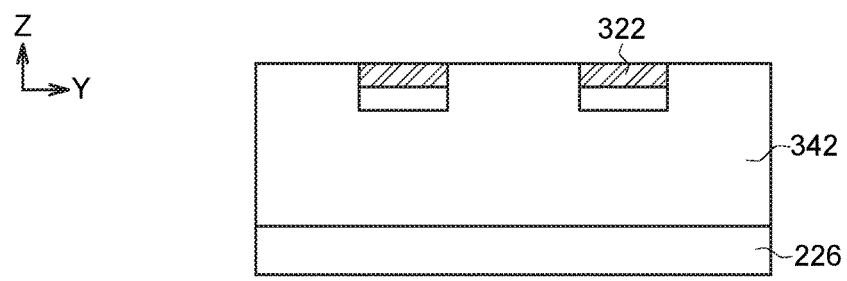
Figure 12A:
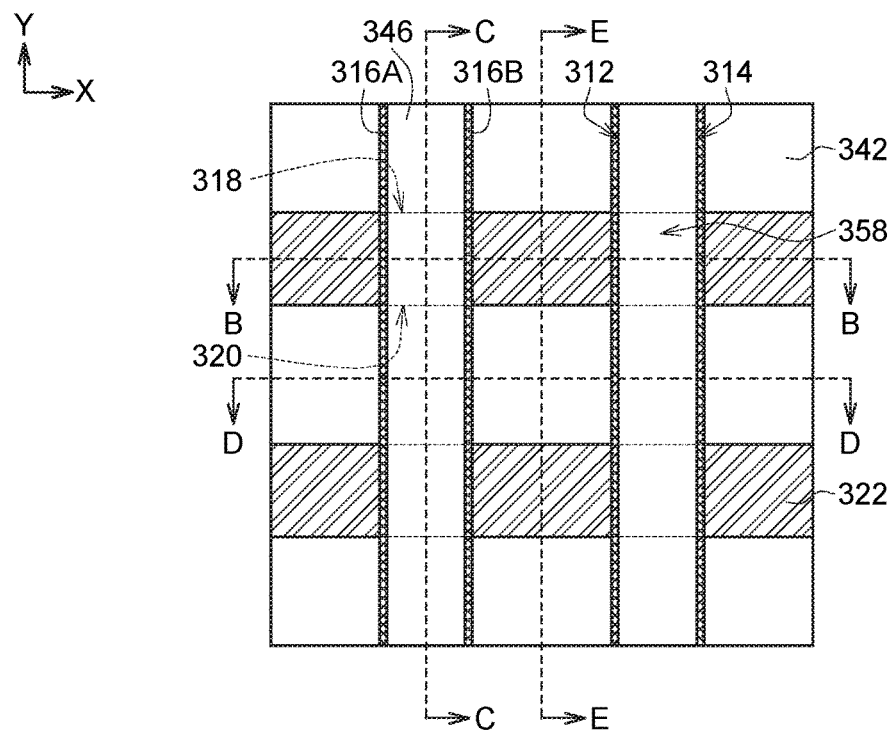
Figure 12B:
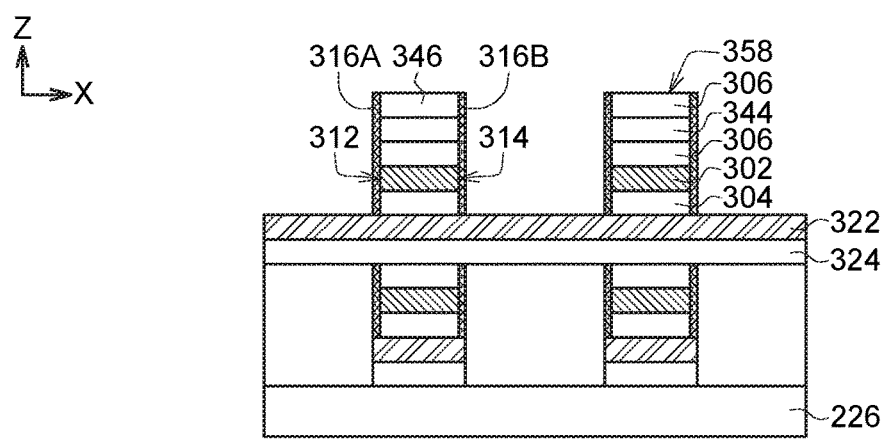
Figure 12C:
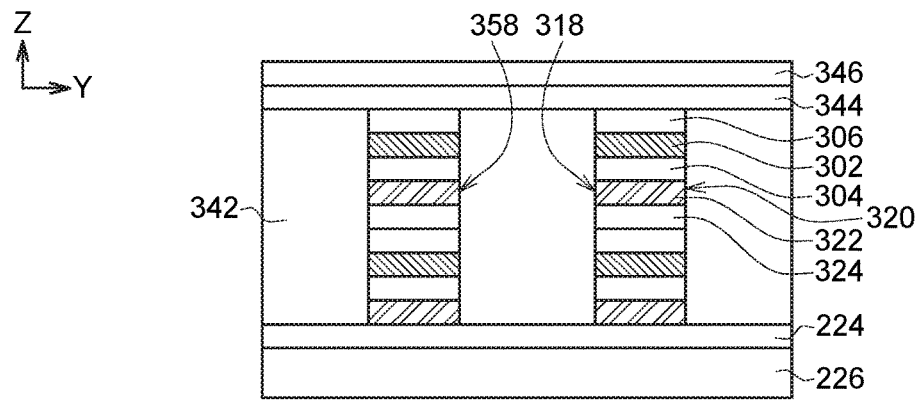
Figure 12D:
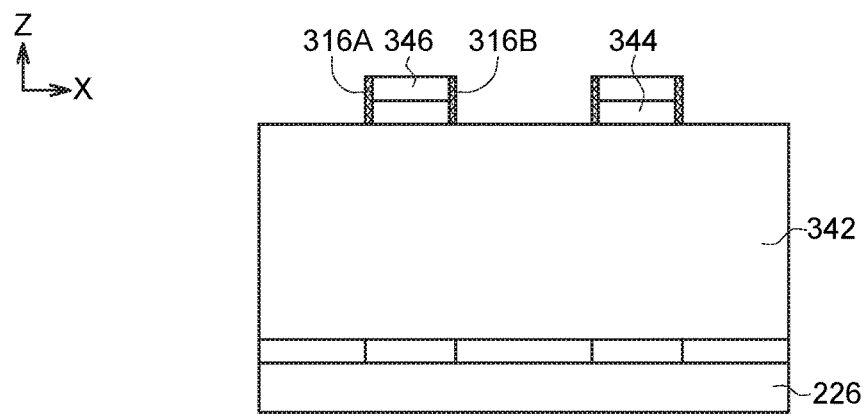
Figure 12E:
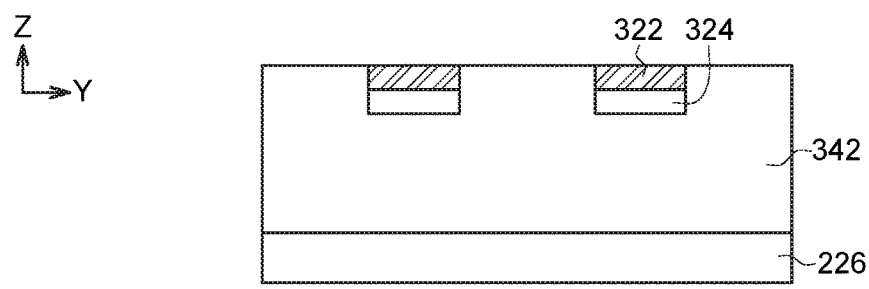
Figure 13A:
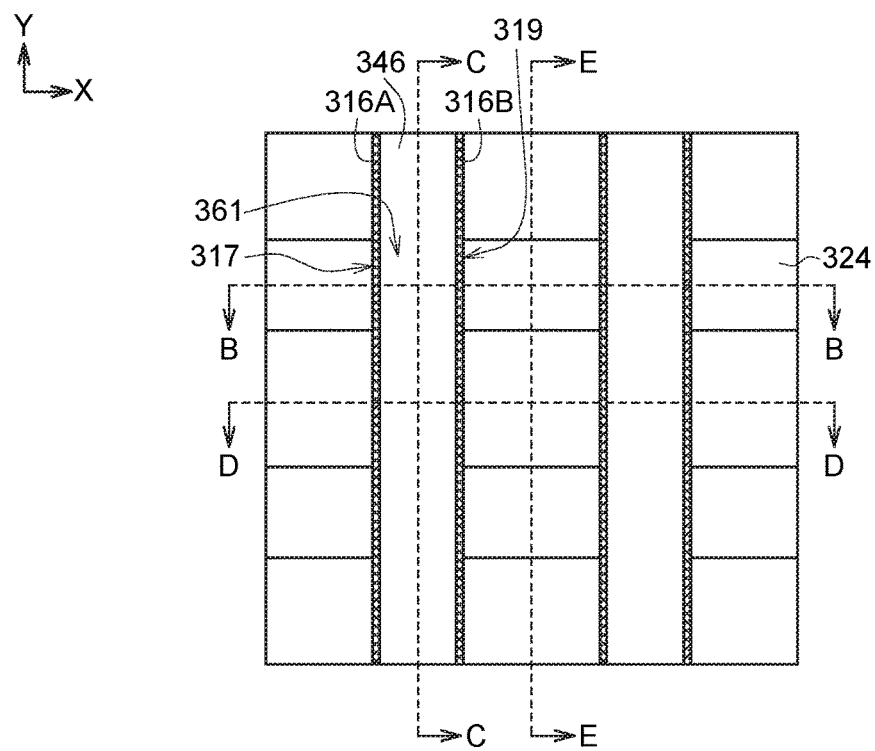
Figure 13B:
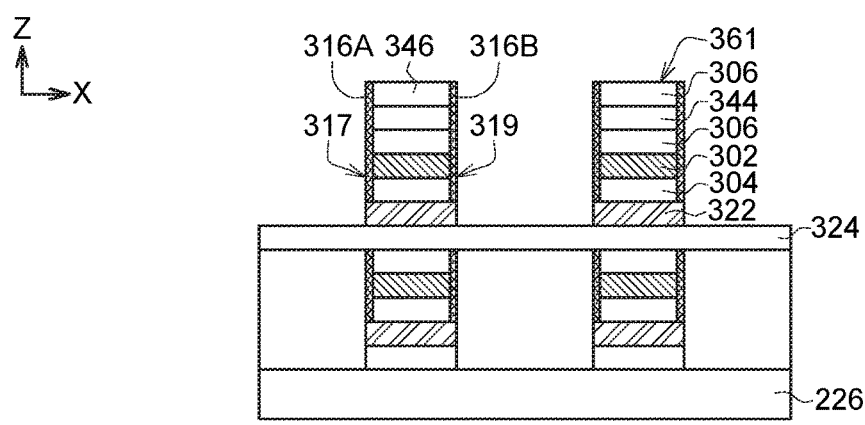
Figure 13C:
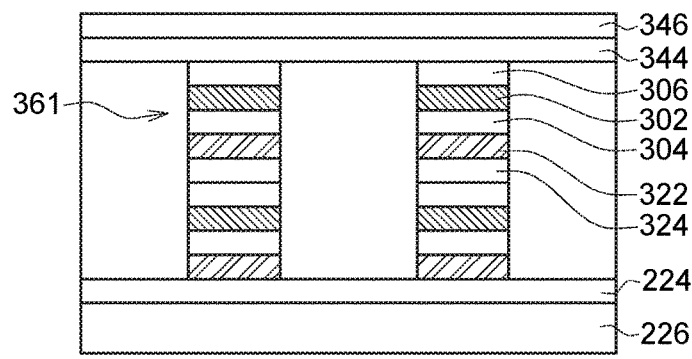
Figure 13D:
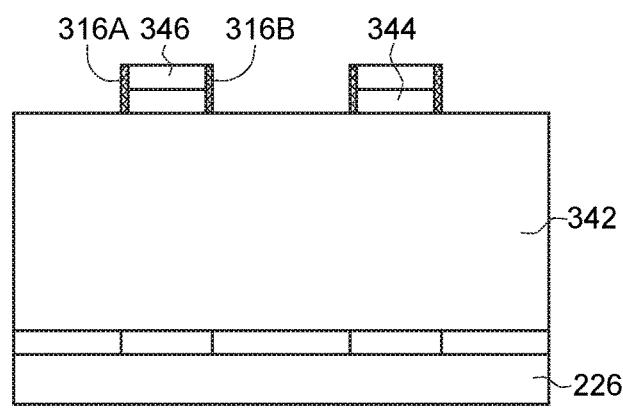
Figure 13E:
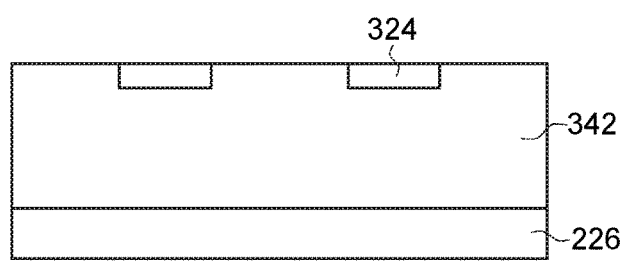
Figure 14A:
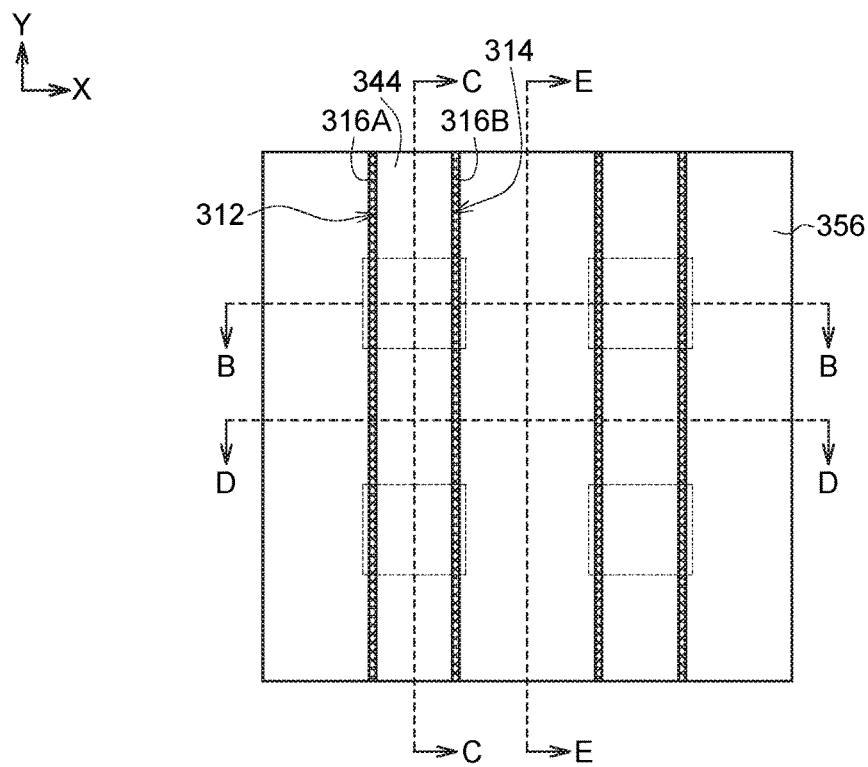
Figure 14B:
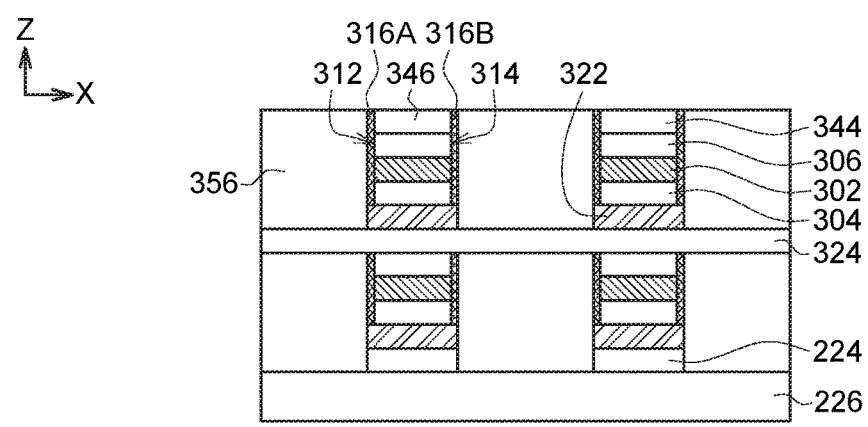
Figure 14C:
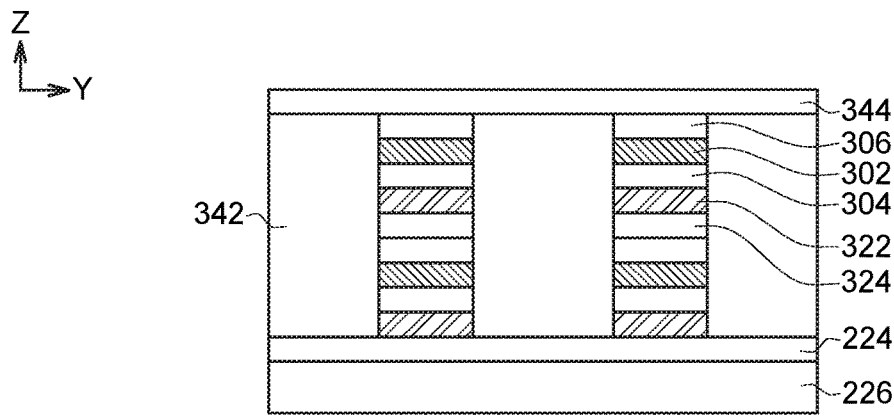
Figure 14D:
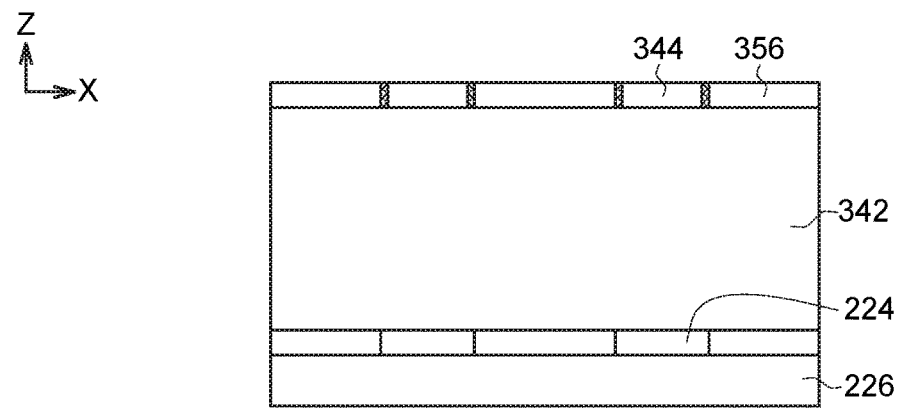
Figure 14E:
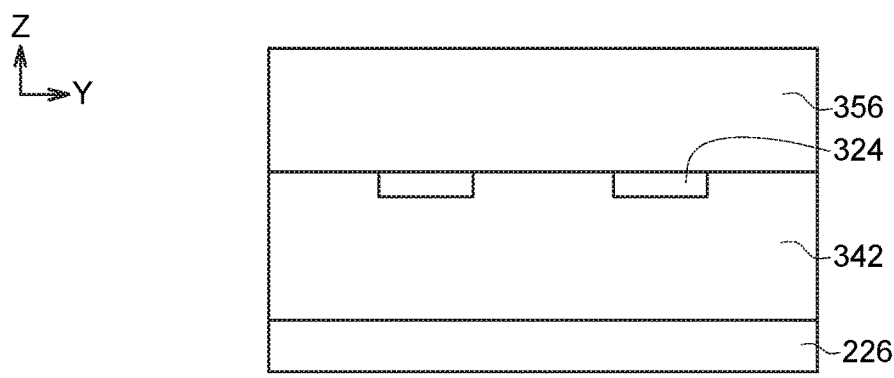

Referring to FIG. 8A and FIG. 8B, each of the memory cells in the lower level of the memory structure comprises the electrode layer 224, the switch material 222 on the electrode layer 224, the first electrode 204 on the switch material 222, the phase change material layer 202 on the first electrode 204, the second electrode 206 on the phase change material layer 202, and the conductive spacers 216A, 216B on the opposing side surfaces 212, 214 of the first electrode 204, the phase change material layer 202 and the second electrode 206.

Referring to FIG. 9A to FIG. 9D, an insulating layer 342 may be deposited on the electrode layer 224 and the insulating layer 240. The insulating layer 342 may comprise an oxide such as silicon oxide, or other suitable insulating materials, such as silicon nitride, silicon oxynitride, etc. A portion of the insulating material over the second electrode 306 may be removed by a CMP method. In an embodiment, a CMP process for removing an oxide may stop on the W film of the TiN/W multi-film second electrode 306.

Referring to FIG. 10A to FIG. 10D, an electrode layer 344 is formed on the second electrode 306 and the insulating layer 342. In an embodiment, the electrode layer 344 comprises a multi-film structure of TiN/W. However, the present disclosure is not limited thereto. The electrode layer 344 may use other single-layer or multi-layer conductive structure designs. A mask layer 346 is formed on the electrode layer 344. In an embodiment, the mask layer 346 comprises an oxide. In other embodiments, the mask layer 346 may comprise other suitable materials, such as silicon nitride or silicon oxynitride, etc.

Referring to FIG. 11A to FIG. 11E, a patterning step is performed to form the patterned mask layer 346 extending in the second direction (or Y-axis direction). Then, an etching step is performed to transfer the pattern down to the electrode layer 344, the second electrode 306, the phase change material layer 302, the first electrode 304 to form a patterned stack 347. The etching step may stop on the switch material 322.

Referring to FIG. 12A to FIG. 12E, conductive spacers 316A, 316B are formed on side surfaces 312, 314 of the stack 347 (FIG. 11A to FIG. 11E) to form a stack 358. In an embodiment, the conductive spacers 316A, 316B comprise TiN. However, the present disclosure is not limited thereto.

In other embodiments, the conductive spacers 316A, 316B may comprise TiAlN, TaN, TaAlN, or other suitable metal nitrides. The conductive spacers 316A, 316B may have thicknesses between 20 angstroms to 50 angstroms. For example, the conductive spacers 316A, 316B may be formed by a method comprising depositing a conductive material on the stack 347 and the switch material 322, and removing a portion of the conductive material on upper surfaces of the switch material 322 and the mask layer 346 by an anisotropic etching to remain a portion of the conductive material on the side surfaces 312, 314 of the stack 347 to form the conductive spacers 316A, 316B. The conductive material may have a thickness between 10 angstroms to 60 angstroms. During this step, the side surfaces 318, 320 of the stack 358 are covered by the insulating layer 342, and thus no conductive spacer is formed on side surfaces 318, 320 of a memory cell (the electrode layer 324, the switch material 322, the first electrode 304, the phase change material layer 302, the second electrode 306 and the electrode layer 344).

Referring to FIG. 13A to FIG. 13E, an etching step using the stack 358 (FIG. 12A to FIG. 12E) as an etching mask may be performed to remove the exposed switch material 322 to form a stack 361 having coplanar side surfaces 317, 319. The etching step may stop on the electrode layer 324. The mask layer 346 and the conductive spacers 316A, 316B used as the etching mask can prevent the first electrode 304, the phase change material layer 302, the second electrode 306 and the electrode layer 344 from damages during the etching step.

Referring to FIG. 14A to FIG. 14E, an insulating layer 356 may be formed on the insulating layer 342, the electrode layer 324. The insulating layer 356 may comprise an oxide, such as silicon oxide, or other suitable insulating materials, such as silicon nitride, silicon oxynitride, etc. A CMP method may be used for the removing step materials over the electrode layer 344. In an embodiment, for example, a CMP for removing the oxide insulating layer 356 may stop on the W film of the TiN/W electrode layer 344.

Referring to FIG. 14A to FIG. 14E, each of the memory cells in the upper level may comprise the electrode layer 324, the switch material 322 on the electrode layer 324, the first electrode 304 on the switch material 322, the phase change material layer 302 on the first electrode 304, the second electrode 306 on the phase change material layer 302, the electrode layer 344 on the second electrode 306, and conductive spacers 316A, 316B on side surfaces 312, 314 of the first electrode 304, the phase change material layer 302, the second electrode 306 and the electrode layer 344.

Referring to FIG. 14A to FIG. 14E, the memory cells in the lower level may share (or commonly use) the electrode layer 224. The memory cells in the upper level may share the electrode layer 324, or share the electrode layer 344. The memory cells in the upper level and the lower level may share the electrode layer 324. In an embodiment, the electrode layer 224 may be used as a WL routing or a BL routing.

Embodiments shown by FIG. 2A to FIG. 14E are illustrated with a structure having two levels each having four memory cells. However, in actual applications, memory structures may design to have more levels and memory cells according to concepts of the present disclosure.

In embodiments, each of the element films (such as the phase change material layer, the first electrode, the second electrode, the conductive spacers, the switch material, the electrode layer) is not limited thereto a PVD method or a CVD method, and may be formed by other suitable methods.

The memory structure according to the present disclosure is not limited thereto a 3D orthogonal array, and may be designed to other kinds of array to memory cells.

According to disclosed embodiments, the side surfaces of the phase change material layer have the conductive spacers providing surfactant effect thereon, therefore the memory structure has a stable resistance and stable operating efficiency. In the method for forming the memory structure, the conductive spacers can be functioned as the etching mask, and therefore can prevent the structure from undesired damage to improve product yield.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory structure, comprising:
   a phase change material layer;
   a first electrode;
   a second electrode, wherein the second electrode and the first electrode are electrically connected to an upper surface and a lower surface of the phase change material layer respectively;
   conductive spacers separated from each other and on side surfaces of the phase change material layer; and
   a switch material electrically connected to the first electrode, wherein the conductive spacers and the switch material have coplanar side surfaces.

2. The memory structure according to claim 1, wherein the conductive spacers are extended from the side surfaces of the phase change material layer onto the first electrode and the second electrode.

3. The memory structure according to claim 1, wherein the conductive spacers are on an upper surface of the switch material.

4. The memory structure according to claim 1, further comprising an electrode layer, wherein the switch material is electrically connected between the first electrode and the electrode layer.

5. The memory structure according to claim 4, comprising memory cells each comprising the first electrode, the second electrode, the phase change material layer, the conductive spacers, the switch material and the electrode layer, wherein the memory cells in a same level share the electrode layer.

6. The memory structure according to claim 4, comprising memory cells each comprising the first electrode, the second electrode, the phase change material layer, the conductive spacers, the switch material and the electrode layer, wherein memory cells in different levels share the electrode layer.

7. The memory structure according to claim 1, comprising memory cells each comprising the first electrode, the second electrode, the phase change material layer and the conductive spacers.

8. The memory structure according to claim 7, further comprising an electrode layer on the second electrodes of the memory cells, wherein the memory cells share the electrode layer.

9. The memory structure according to claim 1, wherein the conductive spacers comprise a metal nitride.

10. The memory structure according to claim 1, wherein the conductive spacers are electrically connected between the first electrode and the second electrode.

11. A memory structure, comprising:
    a first electrode;
    a second electrode;
    a phase change material layer electrically connected between the first electrode and the second electrode;
    conductive spacers separated from each other, each of the conductive spacers contacting with the first electrode, the second electrode and the phase change material layer at same time; and
    a switch material electrically connected to the first electrode, wherein the conductive spacers and the switch material have coplanar side surfaces.

12. The memory structure according to claim 11, wherein the conductive spacers are extended from side surfaces of the phase change material layer onto the first electrode and the second electrode.

13. The memory structure according to claim 11, further comprising an electrode layer, wherein the switch material is electrically connected between the first electrode and the electrode layer.

14. A memory structure, comprising:
    a first electrode;
    a second electrode;
    conductive spacers; and
    a phase change material layer having an upper surface and a lower surface respectively electrically connected to the first electrode and the second electrode, wherein the phase change material layer has four side surfaces, only two opposing side surfaces of the four side surfaces have the conductive spacers thereon.

15. The memory structure according to claim 14, wherein the conductive spacers are extended from the two opposing side surfaces of the phase change material layer onto the first electrode and the second electrode.

16. The memory structure according to claim 14, further comprising a switch material electrically connected to the first electrode.

* * * * *